(12) United States Patent
Morin

(10) Patent No.: US 10,454,280 B2
(45) Date of Patent: Oct. 22, 2019

(54) MODULAR POWER SUPPLY WITH HOT SWAPPABLE PORTION

(71) Applicant: TELCODIUM INC., Boucherville (CA)

(72) Inventor: Eric Morin, Longueuil (CA)

(73) Assignee: TELCODIUM INC., Boucherville (CA)

( * ) Notice: Subject to any disclaimer, the term of this patent is extended or adjusted under 35 U.S.C. 154(b) by 190 days.

(21) Appl. No.: 15/571,094

(22) PCT Filed: Apr. 29, 2016

(86) PCT No.: PCT/CA2016/050497
§ 371 (c)(1),
(2) Date: Nov. 1, 2017

(87) PCT Pub. No.: WO2016/176765
PCT Pub. Date: Nov. 10, 2016

(65) Prior Publication Data
US 2018/0262013 A1    Sep. 13, 2018

Related U.S. Application Data

(60) Provisional application No. 62/155,532, filed on May 1, 2015.

(51) Int. Cl.
| | |
|---|---|
| *H02J 5/00* | (2016.01) |
| *H05K 10/00* | (2006.01) |
| *H02M 1/10* | (2006.01) |
| *H02J 7/04* | (2006.01) |
| *H02M 1/00* | (2006.01) |

(52) U.S. Cl.
CPC .................... *H02J 5/00* (2013.01); *H02J 7/04* (2013.01); *H02M 1/10* (2013.01); *H05K 10/00* (2013.01); *H02M 2001/0022* (2013.01)

(58) Field of Classification Search
CPC  H05K 10/00; H02M 1/10; H02M 2001/0022; H02J 7/04; H02J 5/00
See application file for complete search history.

(56) References Cited

U.S. PATENT DOCUMENTS 6,121,695 A    9/2000   Loh
6,153,947 A *  11/2000  Rockow ................ H02J 7/0024
                                                   307/64

(Continued)

FOREIGN PATENT DOCUMENTS

WO         WO9806158        2/1998

OTHER PUBLICATIONS

Fan Xu et al., High efficiency paralleled three-phase current source front-end rectifiers for data center power supplies with current balancing and hot-swap, XU-2014.
(Continued)

*Primary Examiner* — Alfonso Perez Borroto
*Assistant Examiner* — Esayas G Yeshaw
(74) *Attorney, Agent, or Firm* — Norton Rose Fulbright Canada LLP

(57) ABSTRACT

There is described a modular power supply and a method of connecting and disconnecting the modular parts thereof. First and second portions of the power supply may be connected and disconnected in a hot swap manner while the power supply is in operation.

20 Claims, 7 Drawing Sheets

(56) References Cited

U.S. PATENT DOCUMENTS

| | | | |
|---|---|---|---|
| 6,430,068 B1 | 8/2002 | Sadler et al. | |
| 6,465,909 B1 | 10/2002 | Soo et al. | |
| 7,199,643 B2 | 4/2007 | Nalbant | |
| 7,272,733 B2 | 9/2007 | Pomaranski et al. | |
| 7,371,091 B2 | 5/2008 | Kojori | |
| 7,437,496 B2 | 10/2008 | Oster | |
| 7,634,667 B2 | 12/2009 | Weaver et al. | |
| 7,831,860 B2 | 11/2010 | Hsieh et al. | |
| 7,884,495 B2 | 2/2011 | Kojori | |
| 8,261,102 B2 | 9/2012 | Cheng et al. | |
| 8,645,753 B2 | 2/2014 | Yang et al. | |
| 8,988,860 B2 | 3/2015 | Hammond | |
| 2003/0111909 A1* | 6/2003 | Liu | H02J 1/102 307/64 |
| 2006/0006742 A1* | 1/2006 | Galm | H02J 3/005 307/87 |
| 2009/0102294 A1* | 4/2009 | Hodges | H02H 3/12 307/126 |
| 2009/0160255 A1 | 6/2009 | Grady | |
| 2014/0160686 A1 | 6/2014 | Benson et al. | |
| 2015/0076915 A1 | 3/2015 | Liang et al. | |
| 2019/0148978 A1* | 5/2019 | Chang | H02J 7/025 |

OTHER PUBLICATIONS

International Search Report, dated Jun. 13, 2016, 4 pages, Application No. PCT/CA2016/050497.

\* cited by examiner

MODULAR POWER SUPPLY WITH HOT SWAPPABLE PORTION

CROSS-REFERENCE TO RELATED APPLICATIONS

The present application is a US National Stage of International Application No. PCT/CA2016/050497, filed on Apr. 29, 2016, which claims priority under 35 U.S.C. 119(e) of U.S. Provisional Patent Application No. 62/155,532, filed on May 1, 2015, the contents of which are hereby incorporated by reference in their entirety.

TECHNICAL FIELD

The present disclosure relates to the field of power supply designs.

BACKGROUND OF THE ART

The life span of a power supply, or mean time between failures (MTBF) is estimated at roughly 100,000 hours. Power supplies for servers, industrial control equipment, or other equipment where reliability is important may incorporate redundancy to allow for continued operation in case of failure of the main or primary assembly. Redundancy means duplicating some or all of the components in the power supply so that there is effectively little to no downtime in case of failure. However, duplication of components results in added costs and increased size.

There is a need to increase the MTBF of a power supply while reducing the costs associated with a redundant system.

SUMMARY

There is described a modular power supply and a method of connecting and disconnecting the modular parts thereof. First and second portions of the power supply may be connected and disconnected in a hot swap manner while the power supply is in operation.

In some embodiments, one or more higher failure rate components are provided on the first portion while lower failure rate components are provided on the second portion.

In some embodiments, components for a filtering and protection stage, namely fans, filters, and fuses, are provided on the first portion. Components for a rectifying stage and a conversion stage are on the second portion that attaches to the first portion.

In accordance with a broad aspect, there is provided a power supply comprising a first portion and a second portion. The first portion comprises a first set of components and the second portions comprises a second set of component. The first set of components and the second set of components together form a power supply circuit. The first portion is detachable from and connectable to the second portion while the power supply is in operation. At least one connector is provided for connecting the first portion and the second portion, and a detecting unit is provided at least in part on the second portion and configured for detecting an input feed into the first portion and for managing disconnecting and connecting of the first portion and the second portion while the power supply is in operation.

In some embodiments, at least one component from the first set of components has a higher failure rate than components from the second set of components.

In some embodiments, the first portion comprises a first input feed and a second input feed each configured for providing an AC input voltage; a first filtering and protection unit connected to the first input feed; and a second filtering and protection unit connected to the second input feed and replicating the first filtering and protection unit.

In some embodiments, the second portion comprises a rectifying and power conversion unit configured to receive the AC input voltage provided by a given one of the first and second input feeds and to convert the AC input voltage into a DC output voltage for delivery to a load.

In some embodiments, the detecting unit comprises a first part on the first portion for detecting the input feed and a second part on the second portion for managing the disconnecting and connecting, and the first part transmits detection data to the second part.

In some embodiments, the first part comprises a detector for sensing a voltage and phase on the input feed and sending a signal to the second portion to indicate a presence of AC voltage at the input feed; and a transformer for detecting an AC input voltage at the input feed, reducing the AC input voltage, and transmitting the reduced input voltage to the second portion.

In some embodiments, the detecting unit is configured for determining, when the first portion is connected to the second portion while the power supply is in operation, whether the first portion is compatible with the second portion when the input feed is detected, and rejecting the first portion when the first portion is incompatible with the second portion.

In some embodiments, the detecting unit is configured for determining, when the first portion is connected to the second portion while the power supply is in operation, whether the first portion is at a same voltage level as the second portion, and rejecting the first portion when the first portion is not at the same voltage level as the second portion.

In some embodiments, the first portion comprises a fan and the second portion comprises a relay, and the detecting unit is configured for opening the relay and turning on the fan when the input feed is detected.

In some embodiments, the detecting unit is further configured for closing the relay and turning off the fan when the input feed is no longer detected.

In accordance with another broad aspect, there is provided a method for managing connecting and disconnecting of a first portion and a second portion of a modular power supply. The method comprises monitoring an input feed into the first portion while the power supply is in operation, the first portion comprising a first set of components, the second portion comprising a second set of components, the first set of components and the second set of components together forming a power supply circuit. The method also comprises detecting when the input feed into the first portion transitions from active to inactive; switching off at least one component in the first portion or the second portion when the transition to inactive is detected; detecting when the input feed into the first portion transitions from inactive to active; and switching on the at least one component in the first portion or the second portion when the transition to active is detected.

In some embodiments, the method further comprises, after detecting the transition from inactive to active, determining whether the first portion is compatible with the second portion, and only switching on the at least one component when the first portion is compatible.

In some embodiments, determining whether the first portion is compatible comprises reading a serial identification of the first portion stored in a memory on the first portion.

In some embodiments, the method further comprises, after detecting the transition from inactive to active, determining whether the first portion is at a same voltage level as the second portion, and only switching on the at least one component when the first portion is at the same voltage level as the second portion.

In some embodiments, the method further comprises triggering an inactive feed indicator when the transition from active to inactive is detected.

In some embodiments, the method further comprises triggering an active feed indicator when the transition from inactive to active is detected.

In some embodiments, monitoring an input feed into the first portion comprises monitoring the input feed at the first portion and transmitting detection data to the second portion.

In some embodiments, monitoring the input feed at the first portion comprises sensing a voltage and phase of the input feed and detecting an AC input voltage of the input feed, and wherein transmitting detection data comprises transmitting a signal indicative of a presence of AC voltage at the input feed and a reduced input voltage to the second portion.

In some embodiments, switching off at least one component comprises closing a relay in the second portion and turning off a fan in the first portion, and wherein switching on the at least one component comprises opening the relay and turning on the fan.

In some embodiments, switching off and switching on the at least one component comprises controlling the at least one component from the second portion.

In accordance with yet another broad aspect, there is provided a computer readable medium having stored thereon program instructions executable by a processor to perform the method of managing connecting and disconnecting a first portion and a second portion of a modular power supply, as described herein.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
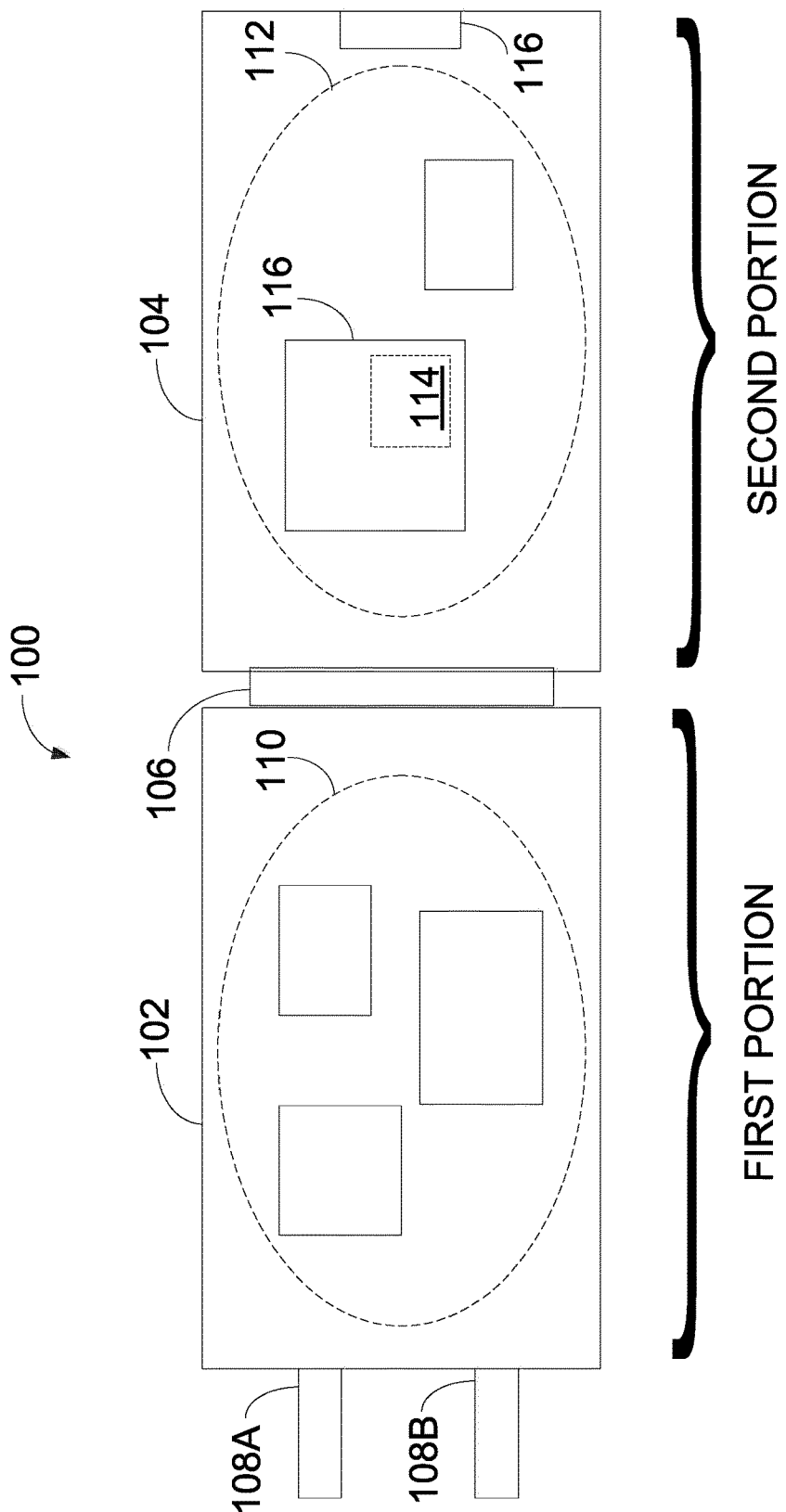
FIG. 1 is a block diagram of an exemplary modular power supply.

There is illustrated in FIG. 1 an exemplary embodiment of a modular power supply 100. The power supply 100 converts mains AC to low-voltage regulated DC power. The power supply 100 is a switch-mode power supply that comprises a filtering and protection stage, a rectifying stage, and an AC/DC power conversion stage which together form a power supply circuit. Two input feeds 108a, 108b are provided and the output power is transmitted to component(s) and/or equipment via an output connector 116.

A first portion 102 is connectable to and detachable from a second portion 104 via at least one connector 106. In addition, the first portion 102 may be removed and inserted while the power supply 100 is in operation, or in other words, without shutting down the power supply. The first portion 102 comprises one or more high failure components 110 while the second portion comprises low failure components 112, relative to the high failure components 110. Together, the high failure components 110 and low failure components 112 form the filtering and protection stage, the rectifying stage, and the AC/DC power conversion stage for converting the mains AC to low-voltage regulated DC power. Components for any one of the stages of the power supply 100 may be provided on either one of the first portion 102 and the second portion 104, as a function of an expected failure rate, whereby higher failure rate components are provided on the first portion 102 and lower failure rate components are provided on the second portion 104. Therefore, for example, there may be components on both the first portion 102 and the second portion 104 that form the rectifying stage. Similarly, there may be components on both portions 102, 104 that form the other stages of the power supply 100.

A detecting unit 114 is provided for detecting an input feed 108a, 108b and for managing disconnecting and connecting of the first portion 102 and the second portion 104 while the power supply 100 is in operation. Managing of the disconnecting and connecting is performed using two protocols, referred to herein as hot insert and hot swap. Hot insert refers to the connecting of the first portion 102 to the second portion 104. Hot swap refers to the disconnecting of the first portion 102 from the second portion 104. In FIG. 1, the detecting unit 114 is shown to reside entirely on the second portion 104, as part of another component 116. Alternatively, the detecting unit 114 may be provided on both the first portion and the second portion, whereby a first part on the first portion and a second part on the second portion together act to detect an input feed and manage disconnecting and connecting of the first portion 102 and the second portion 104. Also alternatively, or in combination therewith, the detecting unit 114 or a part thereof may reside directly on the second portion 104 without forming part of another component.

Figure 2:
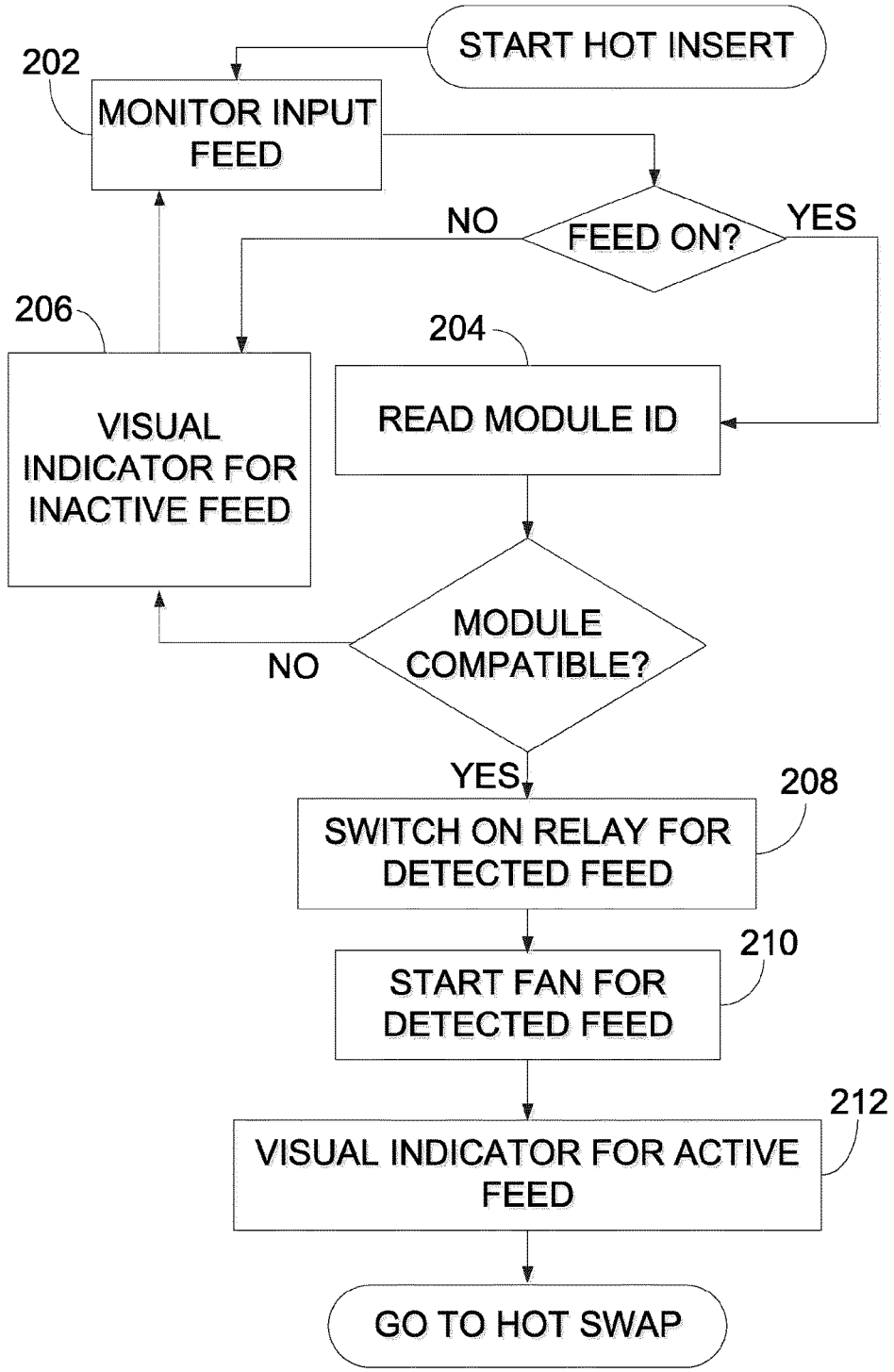
FIG. 2 is a flowchart of an exemplary hot insert protocol.

FIG. 2 is an exemplary flowchart for the hot insert protocol, i.e. connecting the first portion 102 to the second portion 104. The steps are illustrated for a single feed for simplicity and clarity and it should be understood that the flowchart of FIG. 2 may be modified to perform some of the steps for the two feeds or that all of the steps may be repeated independently for the second feed. As per step 202, the input feed is monitored. In some embodiments, if no input feed is detected, a visual indicator for an inactive feed is either turned on or maintained on, as per step 206, and the monitoring activity continues. If no visual indicator is provided on the power supply 100, this step may be omitted. If an input feed is detected, a module ID is read, as per step 204, in order to determine if the newly connected first portion 102 is compatible with the already connected second portion 104. In case of an incompatibility, the visual indicator for an inactive feed may be either turned on or maintained on, as per step 206, and the monitoring activity continues. If the newly connected first portion 102 is found to be compatible with the already connected second portion 104, a relay is switched on for the detected feed, as per step 208, and a fan is activated for the detected feed, as per step 210.

The visual indicator may be text on a display/screen or on a graphical user interface (GUI). It may also be a light with a first color dedicated to an active feed and a second color dedicated to an inactive feed. For example, a green light may be indicative of an active feed while a red light may be indicative of an inactive feed. The light, for example a light emitting diode (LED), may respond differently in different instances. For example, the light may be lit and red when no input feed is detected, whereas it may be flashing and red when an incompatible module has been detected. In addition, there may be a single visual indicator for both input feeds or separate visual indicators for each input feed. Other alternatives for the visual indicator will be readily understood by those skilled in the art.

In some embodiments, delays may be added between two or more of the steps illustrated in the hot insert protocol, in order to ensure that the system is stable before moving on to the next step in the process. For example, there may be a delay between the determination that the newly connected module is compatible with the already connected second portion 104 and the switching on of the relay for the detected feed (step 208). Alternatively, or in combination therewith, there may be a delay between the switching on of the relay for the detected feed (step 208) and the activation of the fan for the detected feed (step 210). The one or more delays may be fixed or variable, and they may be of the order of microseconds, milliseconds, seconds, or any other appropriate timing.

Figure 3:
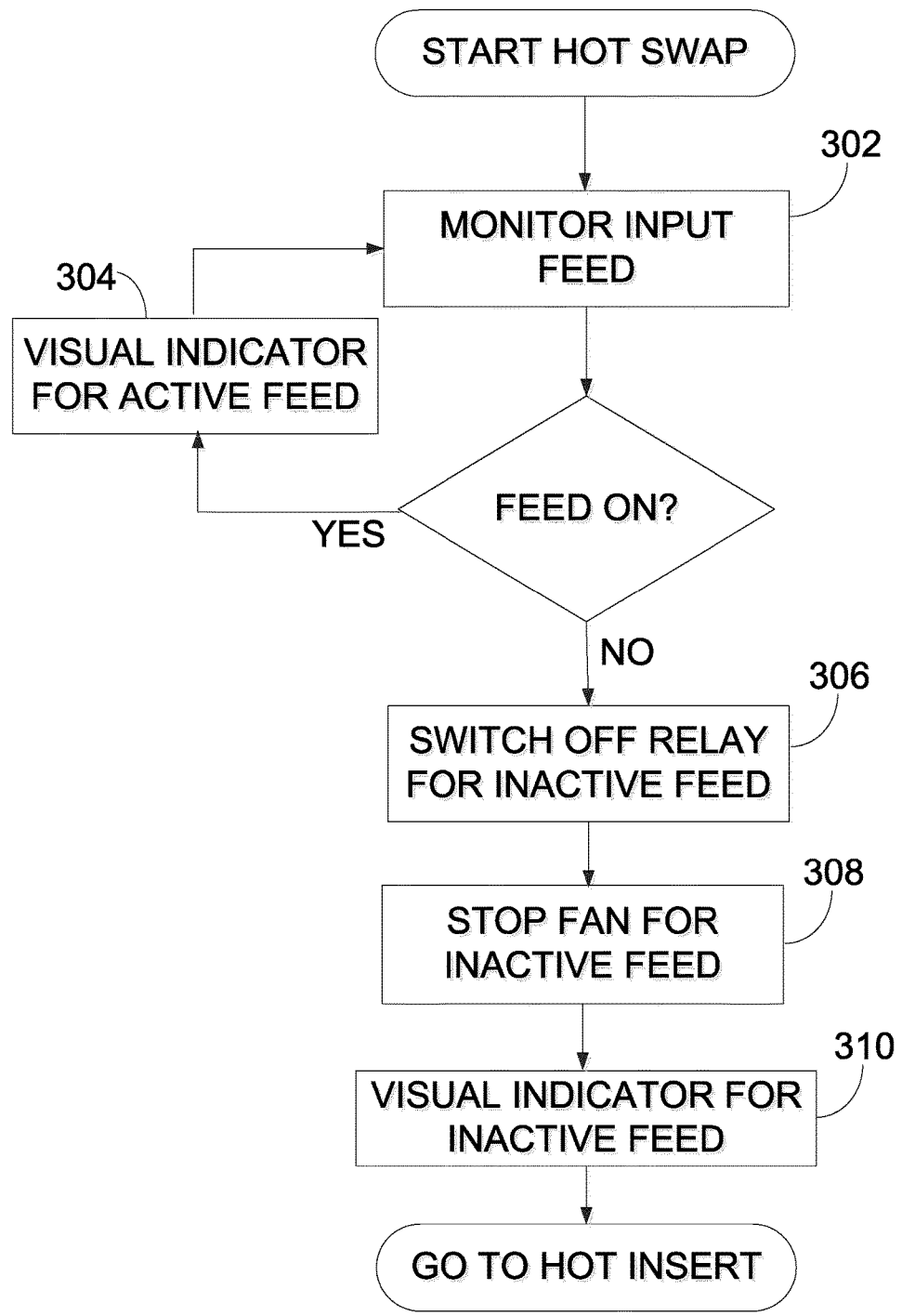
FIG. 3 is a flowchart of an exemplary hot swap protocol.

Once the hot insert protocol is complete, i.e. an input feed has been detected and components for the input feed have been activated, the hot swap protocol may be triggered. An exemplary embodiment for the hot swap protocol is illustrated in FIG. 3. Generally, the hot swap protocol is intended to monitor the input feed and detect a disconnecting of the first portion 102 from the second portion 104. Therefore, it may be set to run continuously or periodically, at regular or irregular intervals. The steps are illustrated for a single feed for simplicity and clarity and it should be understood that the flowchart of FIG. 3 may be modified to perform some of the steps for the two feeds or that some or all of the steps may be repeated independently for the second feed.

Similarly to the hot insert protocol, the hot swap protocol begins with step 302 of monitoring the input feed. As long as the input feed is detected, the visual indicator for an active feed is maintained on, as per step 304 (when the visual indicator is present on the power supply 100). If the input feed is no longer detected, the relay for the previously active feed is switched off, as per step 306, the fan for the previously active feed is stopped, as per step 308, and the visual indicator for the inactive feed is activated, as per step 310. Once the hot swap protocol is complete, i.e. the first portion has been disconnected from the second portion and components for the disconnected input feed have been deactivated, the hot insert protocol may be triggered in order to monitor the feed for a new first portion 102 to be connected to the second portion 104.

In some embodiments, the detecting unit 114 may record a status of each input feed and update the status as the hot swap and/or hot insert protocols are run. For example, input feed 108a may initially be inactive while input feed 108b is active, and after having run through the hot insert protocol and detected a feed at input feed 108a, the status of input feed 108a is updated to active. In some embodiments, the detecting unit 114 provides the status of the input feeds 108a, 108b to another component on the second portion 104, such as a microcontroller.

Figure 4:
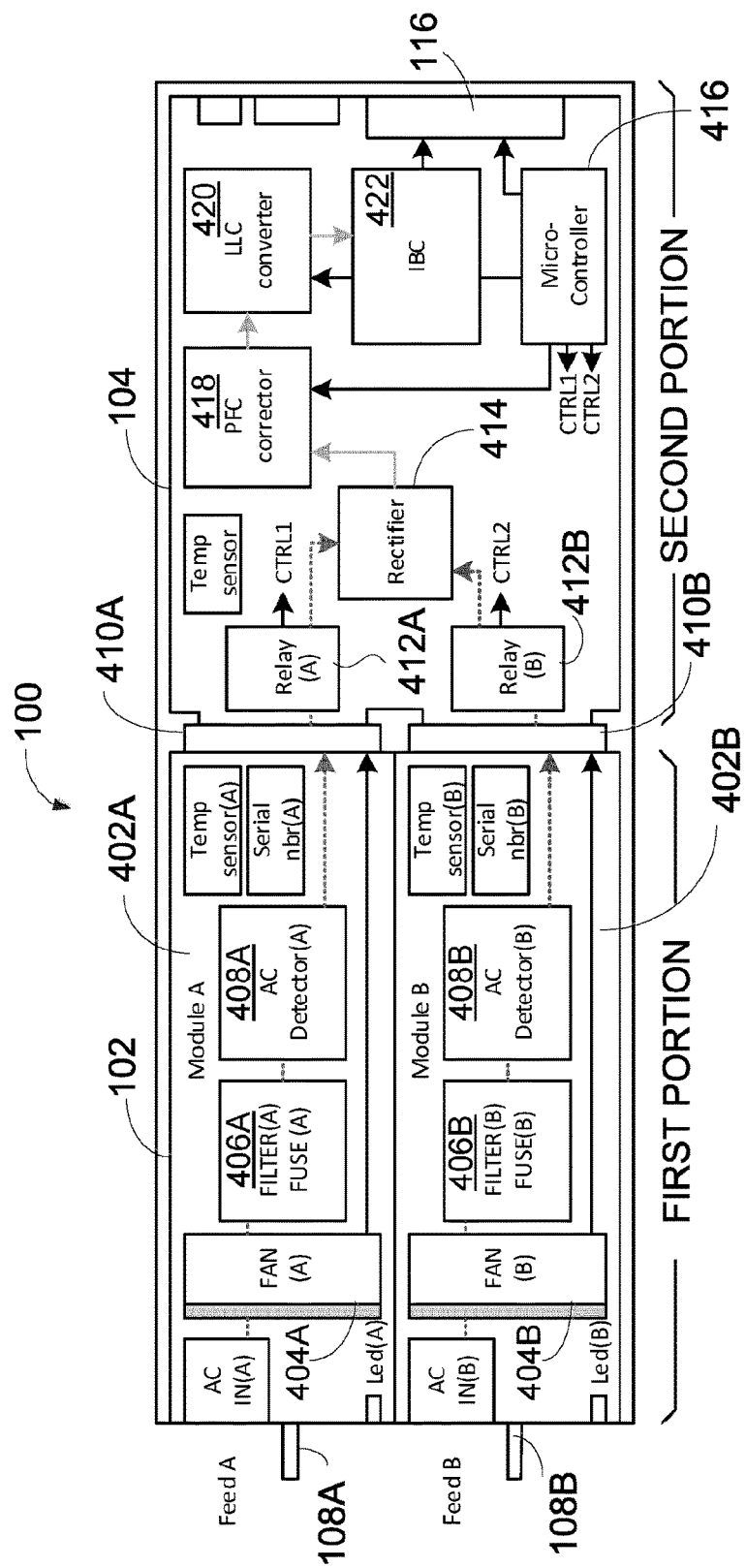
FIG. 4 is a block diagram of a detailed example of a modular power supply with two input feeds.

FIG. 4 is a block diagram of a more detailed example of the modular power supply 100. In this example, the first portion 102 comprises a first input feed 108a and a second input feed 108b each providing an AC input voltage. A set of components for processing input feed 108a are grouped in a first module 402a and a set of components for processing input feed 108b are grouped in a second module 402b. The second module 402b replicates the first module 402a. Each one of the modules 402a, 402b, comprises a fan 404a, 404b, a filtering and protection unit 406a, 406b, and an AC detector unit 408a, 408b connected in series.

The components of the second portion 104 form a rectifying and power conversion unit configured to receive the AC input voltage provided by either one of the input feeds 108a, 108b and to convert the AC input voltage into a DC output voltage for delivery to a load. As understood by those skilled in the art, the number of feeds 108a, 108b is set to two (2) for redundancy purposes. In some embodiments, the main feeds 108a, 108b provide 120 Vac or 240 Vac. In other embodiments, the main feeds 108a, 108b may be universal AC input feeds providing from 85 Vac to 264 Vac, at 43 to 65 Hz. Other embodiments may also apply.

AC signals received through the input feeds 108a, 108b go to respective fan 404a, 404b. Once through the fans 404a, 404b, the AC signals are sent to the filtering and protection units 406a, 406b, which comprise common and differential mode filters and protection fuses. The filtered AC signals are then provided to AC detectors 408a, 408b, which form part of the detecting unit 114. The filtered AC signals and a system neutral are then sent to the second portion 104 of the power supply 100 via corresponding connectors 410a, 410b. The connectors 410a, 410b may be fully enclosed for added safety. In some embodiments, the connectors 410a, 410b are each 30 pin connectors with proper insulation for the input voltage. Other connector formats and/or sizes may also apply.

On the second portion 104 of the modular power supply 100, the AC signals are received by respective relays 412a, 412b. The AC signals passed through the relays 412a, 412b are then fed to a rectifier 414. The relays may be static or mechanical and in this example, are controlled by a microcontroller 416 on which a second part of the detecting unit 114 is provided. The microcontroller 416 uses a detection signal from the detectors 408a, 408b to determine the status of input feeds 108a, 108b. Each detector 408a, 408b detects the value of the input power received from a corresponding main input feed 108a, 108b, and accordingly outputs to the microcontroller 416 data indicating the power input value. It should be understood that the feeds 108a, 108b may not supply exactly 120V or 240V but rather supply a voltage having a value within a range of 120V and 240V. Accordingly, the detectors 408a, 408b may be configured to detect an input voltage between 85V and 190V (and accordingly conclude to a 120V input feed) and a minimum of 205V (and accordingly conclude to a 240V input feed).

In some embodiments, the microcontroller 416 comprises a processor, which may be any device that can perform operations on data. Examples are a central processing unit (CPU), a microprocessor, a field programmable gate array (FPGA), or a reconfigurable processor. The microcontroller 416 may be provided (or be in communication) with a memory, which in one embodiment is a non-volatile memory. The memory may be a main memory, such as a high speed Random Access Memory (RAM), or an auxiliary storage unit, such as a hard disk, flash memory, or a magnetic tape drive. The memory may be any other type of memory, such as a Read-Only Memory (ROM), Erasable Programmable Read-Only Memory (EPROM), electrically-erasable programmable read-only memory (EEPROM), Ferroelectric RAM (FRAM), or optical storage media such as a videodisc and or a compact disc.

A rectified signal is sent from the rectifier 414 to a power factor correction unit 418, and then to an alternating current-direct current (AC-DC) power conversion unit 420. The input voltage is converted into a DC voltage that is output by the power conversion unit 420 and fed to a load via an output connector 116. In some embodiments, an Intermediary Bus Converter (IBC) module 422 serves as a connecting board for the power supply 100. The IBC module 422 takes the base voltage, such as 12 V dc, and converts it to other sub-voltages required by the equipment and/or components to which the power supply 100 is connected. The sub-voltage may vary, such as 3.3 V, 5 V, and others. The IBC module 422 may also serve to synchronize the power supply 100 with equipment and/or components to which it is connected.

As illustrated, the circuit of FIG. 4 shares the rectifying stage circuitry 414 and the AC/DC power conversion stage circuitry 420, which are provided on the second portion 104, while replicating the protection and filtering stage circuitry 406a, 406b, which are provided on the first portion 102. Alternatively, the rectifying stage circuitry 414 and the AC/DC power conversion stage circuitry 420 may be dedicated to module 402a and duplicated for module 402b. Also alternatively, a switching device may be connected between the first and second filtering and protection units 406a, 406b and the rectifying and power conversion unit, the switching device configured to switch between the first and second input feeds 108a, 108b for delivering to the rectifying and power conversion unit the AC input voltage provided by the given input feed. The switching device may be implemented as described in International Patent Application No. PCT/CA2016/050380, the contents of which are hereby incorporated by reference. In some embodiments, the functions of detectors 408a, 408b are combined with those of corresponding switching devices and single switching/detecting modules are provided for each one of input feed 108a and input feed 108b. Alternatively, separate circuitry is provided for detecting and switching in each module 402a, 402b.

Figure 5:
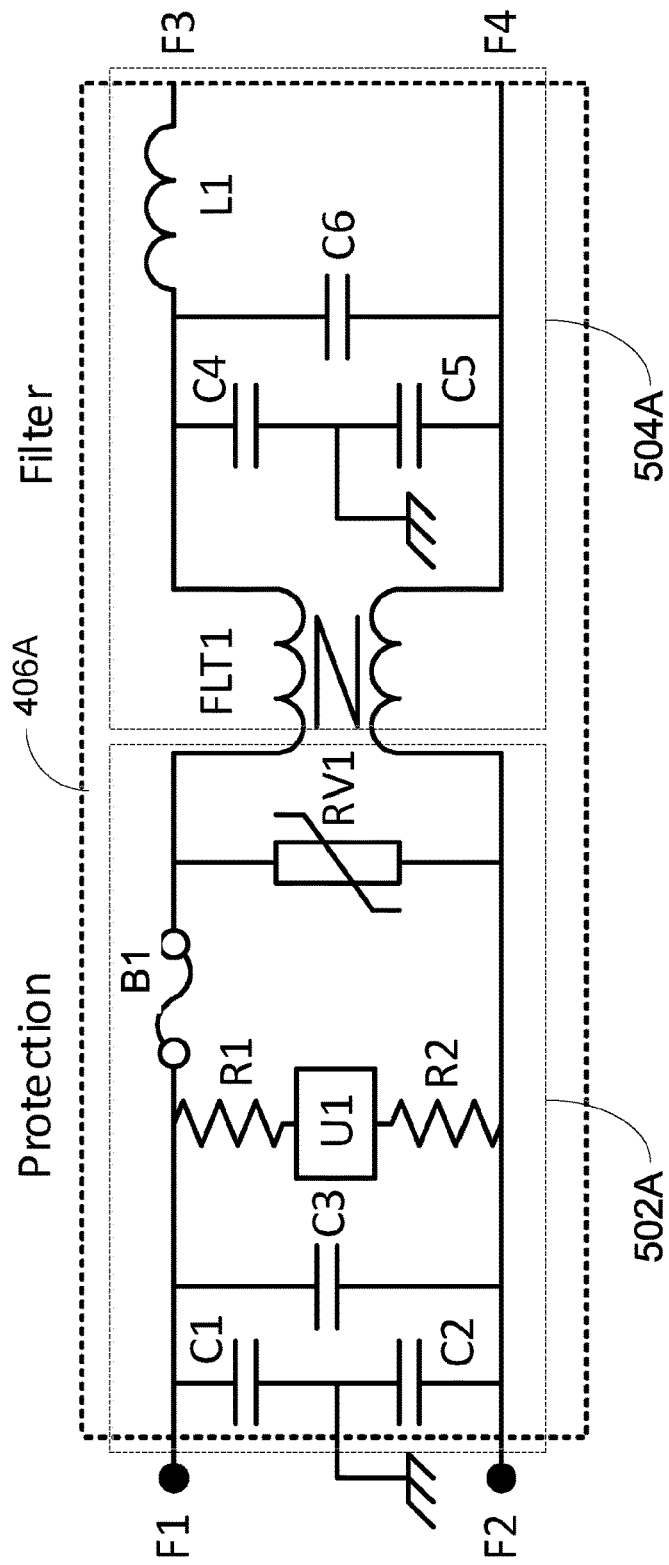
FIG. 5 is a block diagram of an exemplary embodiment of a filtering and protecting circuit.

FIG. 5 illustrates an exemplary configuration for the filtering and protection unit 406a, which is connected to the fan 404a. Since, the filtering and protection unit 406a replicates the filtering and protection unit 406b, only the details of the filtering and protection unit 406a are illustrated in FIG. 5 and discussed. It should be understood that the filtering and protection unit 406b comprises similar components to those of the filtering and protection unit 406a shown in FIG. 5.

An exemplary protection circuit 502a comprises three (3) capacitors C1, C2, and C3. The capacitors C1 and C2 are connected in series between input nodes F1 and F2 of the protection circuit 502a. The capacitor C3 is connected between nodes F1 and F2 in parallel to the series connection of capacitors C1 and C2. The input nodes F1, F2 further connect to the main feed (108a in FIG. 4). The protection circuit 502a also comprises a fuse B1, which provides overcurrent protection and isolates the circuit from the AC supply (e.g. from the main feed 108a) in the event of a fault. A metal oxide varistor RV1 is further provided to clamp the AC input voltage for protecting the circuit during line surge events. The protection circuit 502a also comprises resistors R1, R2 and a specialized integrated circuit (IC) chip U1 that cooperate to discharge all capacitors provided in the protection circuit 502a and in a filter circuit 504a after the line voltage (e.g. the AC input voltage from main feed 108a) has been removed from the circuit, while dissipating zero power during operation. In some embodiments, the IC chip U1 contains a detection circuit and a metal-oxide-semiconductor field-effect transistor (MOSFET) for discharging the capacitors.

The exemplary filter circuit 504a is connected to the protection circuit 502a and comprises capacitors C4, C5, and C6. The capacitors C4 and C5 are connected in series and capacitor C6 is connected in parallel to the series connection of capacitors C4 and C5. A first inductor FLT1 is provided at an input of the filter circuit 504a and connects to an output of the protection circuit 502a (i.e. is connected between terminals of the varistor RV1 and terminals of the capacitor C3). A second inductor L1 is further provided, which is connected to a terminal of capacitor C6 and constitutes with the inductor FLT1 and capacitors C1, C2, C3, C4, C5, C6 an electromagnetic interference (EMI) filter. Such an EMI filter is used for reducing the common and differential mode conducted noise that may be produced by the circuit. The filter circuit 504a has output nodes F3, F4 that connect to the detector 408a of FIG. 4.

Figure 6:
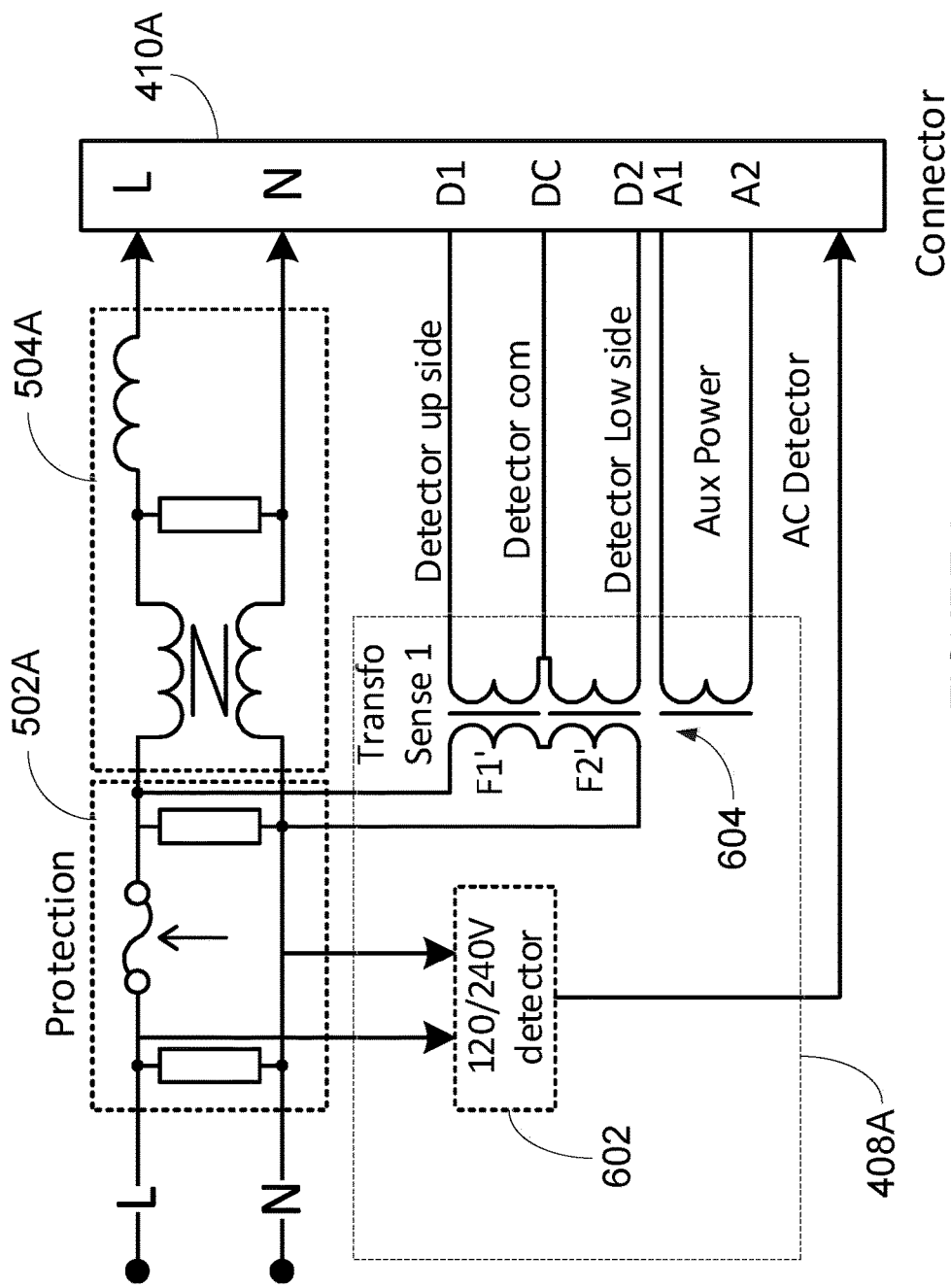
FIG. 6 is a block diagram of an exemplary embodiment of a part of a detecting unit on a first portion of the modular power supply.

FIG. 6 is a detailed example of the detector 408a as connected between the filtering and protection unit 406a (composed of the protection circuit 502a and the filtering circuit 504a) and the connector 410a. As the detector 408b is a duplicate of the detector 408a, only the detector 408a is described in detail herein. As previously indicated, the detector 408a is the portion of the detecting unit 114 that, in some embodiments, resides on the first portion 102 of the modular power supply 100. As illustrated, the detector 408a may comprise a 120/240V detector 602 and a multi-output transformer 604. Together, these two components detect the presence and/or absence of an input feed and supply auxiliary power to the processor of the microcontroller 416 and other components on the second portion 104 of the power supply 100. The 120/240V detector 602 senses the voltage and phase on both lines of the protection circuit 502a, and sends a signal to the microcontroller 416 to indicate the presence of the AC voltage at the input feed 108a. The transformer 604 detects an AC input voltage from F1 or F2, reduces the voltage from 120 or 240 Vac to 12 or 24 Vac, respectively, and transmits the reduced voltage to the microcontroller 416. This is done in order to monitor the AC feed that is provided to the second portion 104 of the power supply 100. In particular, the input values of F1 and F2 may be monitored and used in case of a hot swap/hot insert or for other functionalities. Auxiliary power is also sent to the second portion 104 from the transformer 604 via pins A1 and A2 of the connector 410a, at 14 Vac for an input of 120V or at 28 Vac for an input of 240V. Connector pins D1, and D2 are for the upper and lower portions of the transformer 604. The signal from the transformer 604 at connector pin DC is a voltage reference signal that is combined with two diodes on the second portion 104 to form a half wave rectifier. A rectified voltage value may be sent to the microcontroller 416 for added sensitivity control of the converter 420.

Figure 7:
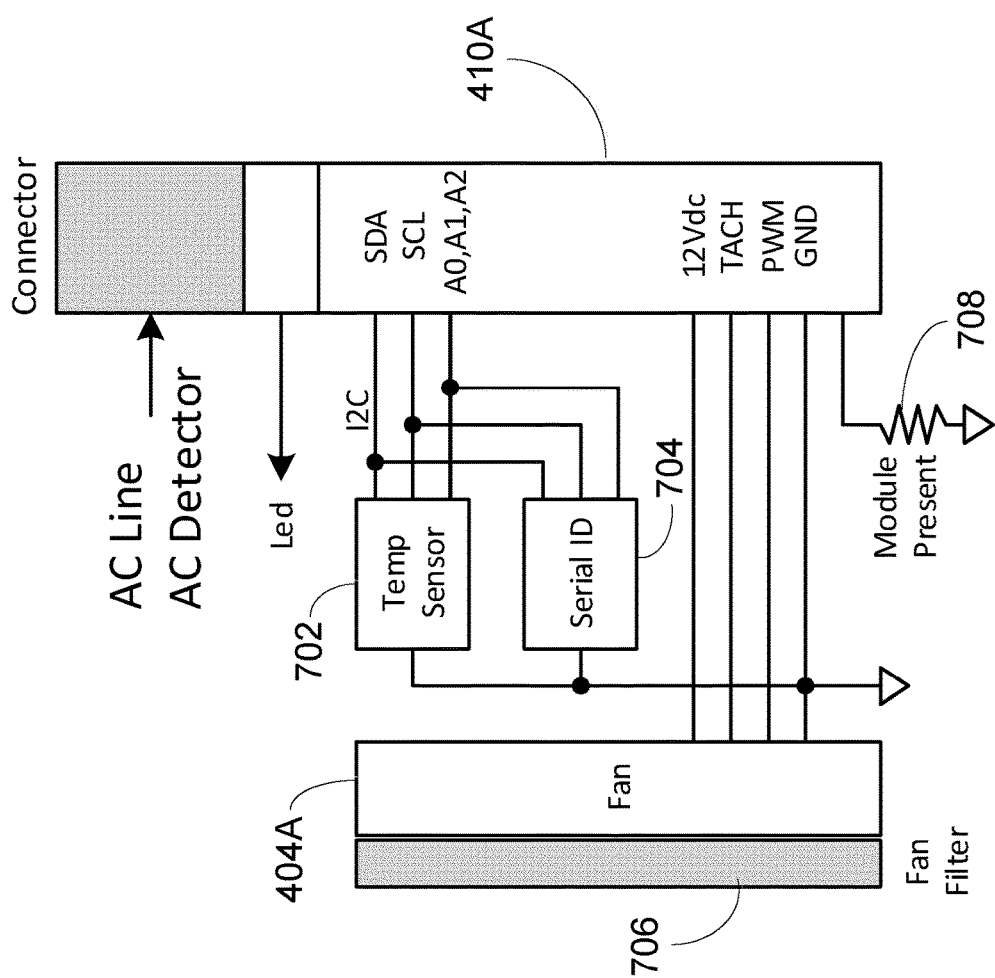
FIG. 7 is a block diagram of an exemplary embodiment of a fan as connected to a connector.

FIG. 7 illustrates an exemplary embodiment for fan 404a, as connected to the connector 410a. Fan 404a may comprise a tachometer and speed control. In some embodiments, fans 404a, 404b are 40×40×20 mm and operate at an airflow of 10 Cubic Feet per Meter (CFM). Note that fans 404a, 404b may also be sized as a function of a desired airflow and the present example is for illustrative purposes only. Fans 404a, 404b may also be fitted with filters 706 for dust particles. In some embodiments, a temperature sensor 702 and a serial ID module 704 are connected between fan 404a and connector 410a. In some embodiments, the connection between the temperature sensor 702 and serial ID module 704 and the connector 410a is by I²C protocol. The serial ID module 704 may be a Serial Electrically Erasable Programmable Read Only Memory (SEEPROM) or another type of memory. The temperature sensor 702 and serial ID module 704 may be controlled by the microcontroller 416. A resistor 708 connected between the connector 410a and Ground may be used to initiate the hot insert and/or hot swap protocols, as illustrated in FIGS. 2 and 3.

When a new first portion 102 is connected to an already connected second portion 104, the microprocessor 416 may determine compatibility of the newly connected first portion 102 with the already connected second portion 104 via the serial ID module 704. In case of incompatibility, a signal is sent to a visual indicator via the connector 410a. When compatibility has been confirmed, the microcontroller 416 may wait to make sure the system is stable and then start the fan 404a of the newly connected first portion 102. The fan 404a may initially be started at high speed for verification purposes for a given period of time, such as 5 seconds, 10 seconds, or any other appropriate amount of time. Fan speed may be confirmed by reading a tachometer signal therefrom. After verification, the microcontroller 416 may sense the temperature of module 402A and/or module 402B via a corresponding temperature sensor 702. Fan speed may be adjusted accordingly to ensure that the temperature inside an enclosure of the power supply 100 remains at an acceptable level, such as at or near ambient temperature. The relays 412a, 412b are opened and closed by the microcontroller 416 as appropriate.

In some embodiments, the power supply 100 is suitable for modules that operate at 120 V and modules that operate at 240 V. As such, the circuitry of the power supply may be adapted to determine not only the presence of an input feed but also whether the input feed is at 120 V or at 240 V. In some embodiments, the power supply 100 is further configured to accept a hot insert only when both input feeds 108a, 108b are of a same voltage level. As such, the hot insert protocol may be modified to determine whether a newly connected first portion 102 is at a same voltage level as an already connected second portion 104 and if not, the relay for the newly connected first portion 102 is not switched on and the visual indicator for an inactive feed is activated or maintained.

The above description is meant to be exemplary only, and one skilled in the relevant arts will recognize that changes may be made to the embodiments described without departing from the scope of the invention disclosed. For example, the blocks and/or operations in the flowcharts and drawings described herein are for purposes of example only. There may be many variations to these blocks and/or operations without departing from the teachings of the present disclosure. For instance, the blocks may be performed in a differing order, or blocks may be added, deleted, or modified. While illustrated in the block diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. The structure illustrated is thus provided for efficiency of teaching the present embodiment.

The present disclosure may be embodied in other specific forms without departing from the subject matter of the claims. Also, one skilled in the relevant arts will appreciate that while the systems, methods, circuits, and computer readable mediums disclosed and shown herein may comprise a specific number of elements/components, the systems, methods, circuits, and computer readable mediums may be modified to include additional or fewer of such elements/components. The present disclosure is also intended to cover and embrace all suitable changes in technology. Modifications which fall within the scope of the present invention will be apparent to those skilled in the art, in light of a review of this disclosure, and such modifications are intended to fall within the appended claims.

The invention claimed is:

1. A power supply comprising:
a first portion comprising a first set of components;
a second portion comprising a second set of components, the first set of components and the second set of components together forming a power supply circuit, the first portion detachable from and connectable to the second portion while the power supply is in operation;
at least one connector for connecting the first portion and the second portion; and
a detecting unit provided at least in part on the second portion and configured for detecting an input feed into the first portion and for managing disconnecting and connecting of the first portion and the second portion while the power supply is in operation.

2. The power supply of claim 1, wherein at least one component from the first set of components has a higher failure rate than components from the second set of components.

3. The power supply of claim 1 or 2, wherein the first portion comprises:
a first input feed and a second input feed each configured for providing an AC input voltage;
a first filtering and protection unit connected to the first input feed; and
a second filtering and protection unit connected to the second input feed and replicating the first filtering and protection unit.

4. The power supply of claim 3, wherein the second portion comprises a rectifying and power conversion unit configured to receive the AC input voltage provided by a given one of the first and second input feeds and to convert the AC input voltage into a DC output voltage for delivery to a load.

5. The power supply of claim 1, wherein the detecting unit comprises a first part on the first portion for detecting the input feed and a second part on the second portion for managing the disconnecting and connecting, and wherein the first part transmits detection data to the second part.

6. The power supply of claim 5, wherein the first part comprises:
a detector for sensing a voltage and phase on the input feed and sending a signal to the second portion to indicate a presence of AC voltage at the input feed; and
a transformer for detecting an AC input voltage at the input feed, reducing the AC input voltage, and transmitting the reduced input voltage to the second portion.

7. The power supply of claim 1, wherein the detecting unit is configured for determining, when the first portion is connected to the second portion while the power supply is in operation, whether the first portion is compatible with the second portion when the input feed is detected, and rejecting the first portion when the first portion is incompatible with the second portion.

8. The power supply of claim 1, wherein the detecting unit is configured for determining, when the first portion is connected to the second portion while the power supply is in operation, whether the first portion is at a same voltage level as the second portion, and rejecting the first portion when the first portion is not at the same voltage level as the second portion.

9. The power supply of claim 1, wherein the first portion comprises a fan and the second portion comprises a relay, and wherein the detecting unit is configured for opening the relay and turning on the fan when the input feed is detected.

10. The power supply of claim 9, wherein the detecting unit is further configured for closing the relay and turning off the fan when the input feed is no longer detected.

11. A method for managing connecting and disconnecting of a first portion and a second portion of a modular power supply, the method comprising:
monitoring an input feed into the first portion while the power supply is in operation, the first portion comprising a first set of components, the second portion comprising a second set of components, the first set of components and the second set of components together forming a power supply circuit;
detecting when the input feed into the first portion transitions from active to inactive;
switching off at least one component in the first portion or the second portion when the transition to inactive is detected;
detecting when the input feed into the first portion transitions from inactive to active; and
switching on the at least one component in the first portion or the second portion when the transition to active is detected.

12. The method of claim 11, further comprising, after detecting the transition from inactive to active, determining whether the first portion is compatible with the second portion, and only switching on the at least one component when the first portion is compatible.

13. The method of claim 12, wherein determining whether the first portion is compatible comprises reading a serial identification of the first portion stored in a memory on the first portion.

14. The method of claim 11, further comprising, after detecting the transition from inactive to active, determining whether the first portion is at a same voltage level as the second portion, and only switching on the at least one component when the first portion is at the same voltage level as the second portion.

15. The method of claim 11, further comprising triggering an inactive feed indicator when the transition from active to inactive is detected.

16. The method of claim 11, further comprising triggering an active feed indicator when the transition from inactive to active is detected.

17. The method of claim 11, wherein monitoring an input feed into the first portion comprises monitoring the input feed at the first portion and transmitting detection data to the second portion.

18. The method claim 17, wherein monitoring the input feed at the first portion comprises sensing a voltage and phase of the input feed and detecting an AC input voltage of the input feed, and wherein transmitting detection data comprises transmitting a signal indicative of a presence of AC voltage at the input feed and a reduced input voltage to the second portion.

19. The method of claim 11, wherein switching off at least one component comprises closing a relay in the second portion and turning off a fan in the first portion, and wherein switching on the at least one component comprises opening the relay and turning on the fan.

20. The method of claim 11, wherein switching off and switching on the at least one component comprises controlling the at least one component from the second portion.

* * * * *